United States Patent
Macheiner et al.

(10) Patent No.: US 10,147,703 B2
(45) Date of Patent: Dec. 4, 2018

(54) SEMICONDUCTOR PACKAGE FOR MULTIPHASE CIRCUITRY DEVICE

(71) Applicant: Infineon Technologies AG, Neubiberg (DE)

(72) Inventors: Stefan Macheiner, Kissing (DE); Amirul Afiq Hud, Melaka (MY); Teck Sim Lee, Melaka (MY); Thomas Stoek, Buxtehude (DE); Lee Shuang Wang, Melaka (MY); Chooi Mei Chong, Melaka (MY); Wei Hing Tan, Melaka (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/469,112

(22) Filed: Mar. 24, 2017

(65) Prior Publication Data
US 2018/0277513 A1    Sep. 27, 2018

(51) Int. Cl.
*H01L 23/52*        (2006.01)
*H01L 25/065*       (2006.01)
(Continued)

(52) U.S. Cl.
CPC ........ *H01L 25/0655* (2013.01); *H01L 23/057* (2013.01); *H01L 23/49805* (2013.01);
(Continued)

(58) Field of Classification Search
CPC ............ H01L 23/057; H01L 23/49805; H01L 23/49844; H01L 23/5386; H01L 25/50; H01L 25/0655
(Continued)

(56) References Cited

U.S. PATENT DOCUMENTS 6,680,593 B2 *  1/2004  Gotou ................... G11B 19/28
                                                   318/400.04
7,173,333 B2     2/2007  Hata et al.
(Continued)

FOREIGN PATENT DOCUMENTS

CN        102569361 A      7/2012
CN        102915987 A      2/2013
(Continued)

OTHER PUBLICATIONS

International Rectifier, "IRDM982 Series—IRDM982-025MB, IRDM982-035MB Complete Motion Controller Module for PM AC fan", Apr. 8, 2015, 27 pp.
(Continued)

*Primary Examiner* — Luan C Thai
(74) *Attorney, Agent, or Firm* — Shumaker & Sieffert, P.A.

(57) ABSTRACT

In some examples, a device includes a power supply element and a reference voltage element, wherein the reference voltage element is electrically isolated from the power supply element. The device further includes a high-side semiconductor die including at least two high-side transistors, wherein each high-side transistor of the at least two high-side transistors is electrically connected to the power supply element. The device also includes a low-side semiconductor die including at least two low-side transistors, wherein each low-side transistor of the at least two low-side transistors is electrically connected to the reference voltage element. The device includes at least two switching elements, wherein each switching element of the at least two switching elements is electrically connected to a respective high-side transistor of the at least two high-side transistors and to a respective low-side transistor of the at least two low-side transistors.

23 Claims, 10 Drawing Sheets

(51) Int. Cl.
*H01L 23/498* (2006.01)
*H01L 23/538* (2006.01)
*H01L 23/057* (2006.01)
*H01L 25/00* (2006.01)
*H01L 29/78* (2006.01)

(52) U.S. Cl.
CPC .... *H01L 23/49844* (2013.01); *H01L 23/5386* (2013.01); *H01L 25/50* (2013.01); *H01L 29/7827* (2013.01)

(58) Field of Classification Search
USPC ........................................................ 257/691
See application file for complete search history.

(56) References Cited

U.S. PATENT DOCUMENTS

| | | | |
|---|---|---|---|
| 7,342,378 B2* | 3/2008 | Sakamoto | H02P 6/185 318/700 |
| 7,348,687 B2* | 3/2008 | Aichriedler | B60R 21/017 307/10.1 |
| 7,449,778 B2 | 11/2008 | Sander | |
| 7,589,400 B2* | 9/2009 | Hozoji | H01L 24/40 257/673 |
| 7,880,280 B2 | 2/2011 | Otremba | |
| 7,943,955 B2 | 5/2011 | Haeberlen et al. | |
| 8,018,189 B2* | 9/2011 | Narumi | H02P 6/18 318/257 |
| 8,138,585 B2 | 3/2012 | Liu et al. | |
| 8,258,732 B2* | 9/2012 | Iwaji | H02P 6/20 318/400.01 |
| 8,488,316 B2 | 7/2013 | Zeng et al. | |
| 8,674,636 B2* | 3/2014 | Matsuo | B60L 7/14 318/400.01 |
| 8,704,269 B2 | 4/2014 | Macheiner et al. | |
| 9,087,829 B2 | 7/2015 | Macheiner et al. | |
| 9,257,907 B2* | 2/2016 | Nomiyama | H02M 3/158 |
| 9,324,851 B2 | 4/2016 | Nega et al. | |
| 2005/0127755 A1 | 6/2005 | Aichriedler et al. | |
| 2006/0071860 A1 | 4/2006 | Hozoji et al. | |
| 2007/0081280 A1 | 4/2007 | Strzalkowski et al. | |
| 2007/0252265 A1 | 11/2007 | Sander | |
| 2012/0014059 A1 | 1/2012 | Zeng et al. | |
| 2013/0032855 A1 | 2/2013 | Macheiner et al. | |
| 2013/0049137 A1 | 2/2013 | Uno et al. | |
| 2015/0145112 A1 | 5/2015 | Otremba | |
| 2016/0172280 A1 | 6/2016 | Ranmuthu | |
| 2017/0230017 A1 | 8/2017 | Hori | |

FOREIGN PATENT DOCUMENTS

| | | |
|---|---|---|
| DE | 102006020243 B3 | 1/2008 |
| DE | 102008006835 A1 | 9/2008 |
| DE | 102012213208 A1 | 2/2013 |
| DE | 102014117019 A1 | 5/2015 |
| DE | 102014203899 A1 | 9/2015 |
| WO | 2009154969 A2 | 12/2009 |

OTHER PUBLICATIONS

U.S. Appl. No. 15/287,368, filed by Eung San Cho, filed Oct. 6, 2016.
Notice of Allowance from U.S. Appl. No. 15/287,368, dated Sep. 7, 2017, 9 pp.
Office Action from U.S. Appl. No. 15/287,368, dated Jan. 9, 2018, 19 pp.
Response to Office Action dated Jan. 9, 2018, from U.S. Appl. No. 15/287,368, filed Apr. 3, 2018, 12 pp.
Notice of Allowance from U.S. Appl. No. 15/287,368, dated Jul. 16, 2018, 8 pp.

* cited by examiner

US 10,147,703 B2

SEMICONDUCTOR PACKAGE FOR MULTIPHASE CIRCUITRY DEVICE

TECHNICAL FIELD

This disclosure relates to semiconductor packaging, and more specifically, to semiconductor packages for power electronics.

BACKGROUND

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

Some circuits may combine two or more half-bridge circuits to create a multiphase power converter. The multiphase power converter may have an output node for each phase of the circuit. Multiphase power converters may be used as direct-current-to-direct-current (DC/DC) converters or alternating-current-to-DC (AC/DC) converters in a variety of applications, such as electronics, automotive, electric motors, lighting, and display devices, among others.

SUMMARY

This disclosure describes a semiconductor package for a multiphase power converter including a high-side semiconductor die and a low-side semiconductor die, as well as techniques for manufacturing the semiconductor package. The semiconductor package may be used for controller devices or for power delivery to devices, and may find specific use for controlling a multiphase electric motor.

In some examples, a device includes a power supply element and a reference voltage element, wherein the reference voltage element is electrically isolated from the power supply element. The device further includes a high-side semiconductor die including at least two high-side transistors, wherein each high-side transistor of the at least two high-side transistors is electrically connected to the power supply element. The device also includes a low-side semiconductor die including at least two low-side transistors, wherein each low-side transistor of the at least two low-side transistors is electrically connected to the reference voltage element. The device includes at least two switching elements, wherein each switching element of the at least two switching elements is electrically connected to a respective high-side transistor of the at least two high-side transistors and to a respective low-side transistor of the at least two low-side transistors.

In some examples, a method for assembling a semiconductor device, the method including electrically connecting each high-side transistor of at least two high-side transistors in a high-side semiconductor die to a power supply element. The method further includes electrically connecting each low-side transistor of at least two low-side transistors in a low-side semiconductor die to a reference voltage element, wherein the reference voltage element is electrically isolated from the power supply element. The method also includes electrically connecting each switching element of at least two switching elements to a respective high-side transistor of the at least two high-side transistors. The method also includes electrically connecting each switching element of at least two switching elements to a respective low-side transistor of the at least two low-side transistors.

In some examples, a device includes an electric motor including a stator including at least two stator coils and a rotor including at least two rotor coils. The device further includes a printed circuit board (PCB) including at least two traces and power conversion device mounted on the PCB, wherein the power conversion device includes a power supply element and a reference voltage element, wherein the reference voltage element is electrically isolated from the power supply element. The power conversion device also includes a high-side semiconductor die including at least two vertical high-side transistors, wherein each vertical high-side transistor of the at least two vertical high-side transistors is electrically connected to the power supply element. The power conversion device further includes a low-side semiconductor die including at least two vertical low-side transistors, wherein each vertical low-side transistor of the at least two vertical low-side transistors is electrically connected to the reference voltage element. The power conversion device includes at least two switching elements, wherein each switching element of the at least two switching elements is electrically connected to a respective vertical high-side transistor of the at least two vertical high-side transistors and to a respective vertical low-side transistor of the at least two vertical low-side transistors. Each switching element of the at least two switching elements is electrically connected through a respective trace of the at least two traces to a respective rotor coil of the at least two rotor coils or to a respective stator coil of the at least two stator coils.

The details of one or more examples are set forth in the accompanying drawings and the description below. Other features, objects, and advantages will be apparent from the description and drawings, and from the claims.

DETAILED DESCRIPTION

A multiphase power conversion device may include a half-bridge circuit or an H-bridge circuit for each phase of the multiphase power conversion device. In the example where each phase includes a half-bridge circuit, each phase of the multiphase power conversion device may contain a high-side transistor and a low-side transistor. A device of this disclosure may include a single high-side semiconductor die, where the high-side transistors are integrated into the single high-side semiconductor die. The device may include a single low-side semiconductor die, where the low-side transistors are integrated into the single low-side semiconductor die.

By integrating the high-side transistors and by integrating the low-side transistors, the multiphase power conversion device may be smaller than another multiphase power conversion device including discrete transistors. The transistors in an integrated semiconductor die may be positioned closer together than discrete transistors. Due to its smaller size and smaller form factor, the device may take up less space on a printed circuit board (PCB). The device may cost less because less material may be required to assemble the device.

In addition, assembly of the device may be less expensive, faster, and less complex, as compared to the assembly of another device with discrete transistors. Instead of individually soldering each discrete transistor to a power supply element and/or reference voltage element, two integrated semiconductor die may be soldered to the elements. Thus, there may be fewer components to assemble in a device of this disclosure. For example, assembly of a three-phase device may include two steps: connecting a high-side semiconductor die to a power supply element and connecting a low-side semiconductor die to a reference voltage element, instead of individually connecting each discrete transistor to the respective element.

Assembling integrated semiconductor die of a multiphase power conversion device including may have a lower likelihood of faulty connections, as compared to a device including discrete transistors. For example, when soldering discrete transistors in a multiphase device, the solder may run together causing parameter drift. Soldering integrated transistors may reduce the likelihood of the solder running together.

Figure 1:
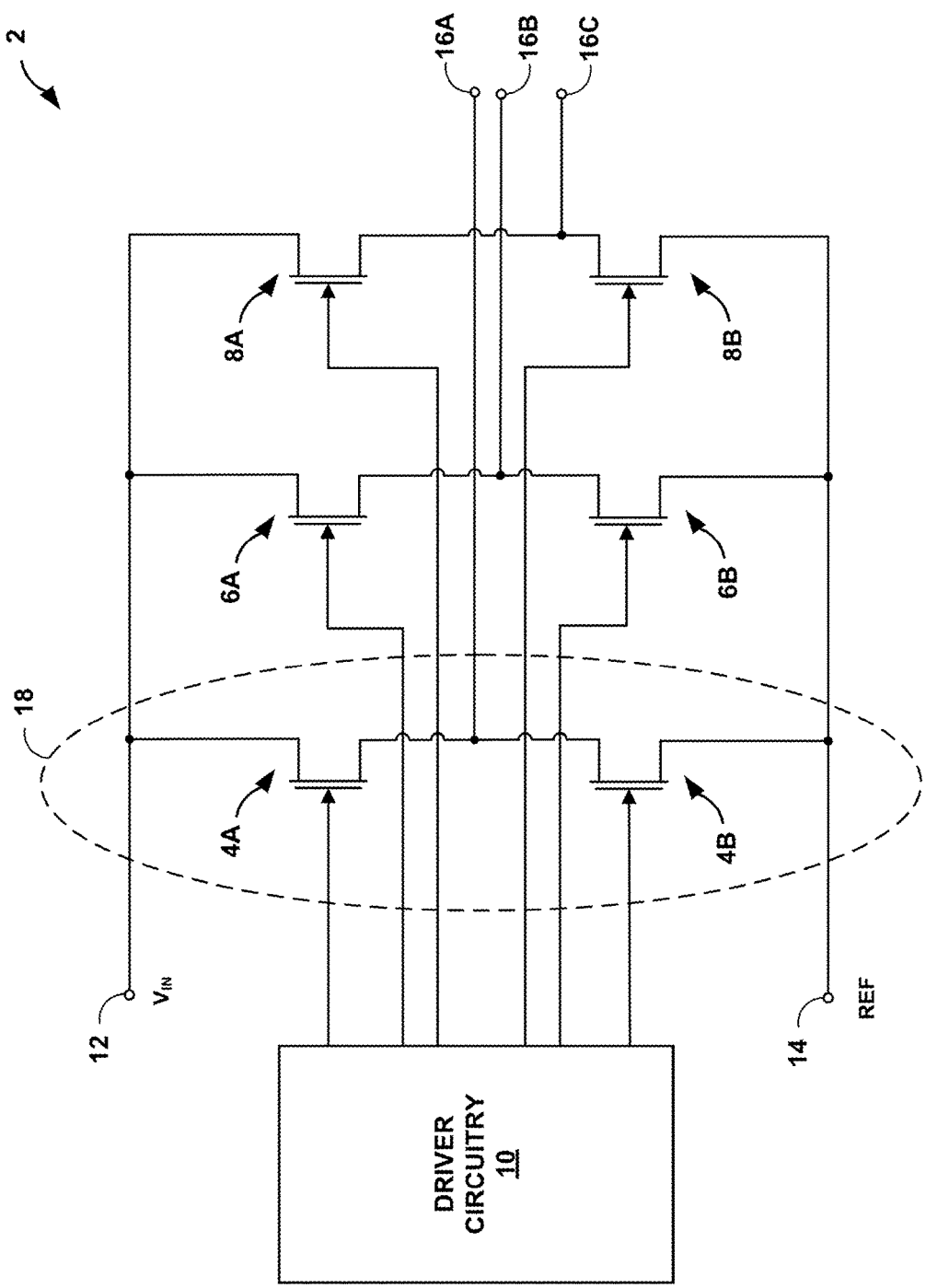
FIG. 1 is a circuit diagram of multiphase power conversion circuitry, in accordance with some examples of this disclosure.

FIG. 1 is a circuit diagram of multiphase power conversion circuitry, in accordance with some examples of this disclosure. Device 2 includes transistors 4A, 4B, 6A, 6B, 8A, and 8B, input node 12, reference node 14, and output nodes 16A-16C. In some examples, driver circuitry 10 may also be a part of device 2.

Device 2 may be a power conversion device including the power conversion circuitry shown in FIG. 1. In some examples, device 2 may include multiphase power conversion circuitry such as a half-bridge direct-current-to-direct-current (DC/DC) buck converter for converting an input DC signal to an output DC signal with a lower voltage. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multiphase power conversion circuitry and alternating-current-to-DC (AC/DC) power conversion circuitry.

FIG. 1 depicts device 2 as including three phases, but device 2 may include any other number of phases. In some examples, device 2 may include two phases, three phases, four phases, or more than four phases. In some examples, device 2 may include a half-bridge circuit for each phase.

Device 2 may include transistors 4A, 4B, 6A, 6B, 8A, and 8B and driver circuitry 10. In some examples, device 2 may contain more or fewer components than depicted in FIG. 1. Device 2 includes input node 12, reference node 14, and output nodes 16A-16C, as well as other nodes not shown in FIG. 1. Nodes 12, 14, and 16A-16C may be configured to connect to external components. For example, input node 12 may connect to an input voltage such as a power supply, reference node 14 may connect to a reference voltage, such as reference ground, and output nodes 16A-16C may connect to a load such as an electronic device. Input node 12 may be electrically isolated from reference node 14. Each output nodes 16A-16C may deliver one phase of an output voltage to an electrical load. In some examples, driver circuitry 10 may connect to an external circuit through a node (not shown in FIG. 1).

Transistors 4A, 4B, 6A, 6B, 8A, and 8B may include metal-oxide semiconductor (MOS) field-effect transistors (FETs), bipolar junction transistors (BJTs), and/or insulated-gate bipolar transistors (IGBTs). Transistors 4A, 4B, 6A, 6B, 8A, and 8B may include n-type transistors or p-type transistors. In some examples, transistors 4A, 4B, 6A, 6B, 8A, and 8B may include other analog devices such as diodes. Transistors 4A, 4B, 6A, 6B, 8A, and 8B may also include freewheeling diodes connected in parallel with transistors to prevent reverse breakdown of transistors 4A, 4B, 6A, 6B, 8A, and 8B. In some examples, transistors 4A, 4B, 6A, 6B, 8A, and 8B may operate as switches, as analog devices, and/or power transistors. In some examples, each of transistors 4A, 4B, 6A, 6B, 8A, and 8B may include more than one transistor electrically connected in parallel and configured to operate together as a single switch.

Although transistors 4A, 4B, 6A, 6B, 8A, and 8B are shown in FIG. 1 as MOSFET symbols, it is contemplated that any electrical device that is controlled by a voltage may be used in place of the MOSFETs as shown. For example, transistors 4A, 4B, 6A, 6B, 8A, and 8B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 4A, 4B, 6A, 6B, 8A, and 8B may include various material compounds, such as silicon (Si), silicon carbide (SiC), Gallium Nitride, or any other combination of one or more semiconductor materials. To take advantage of higher power density requirements in some circuits, power converters may operate at higher frequencies. Improvements in magnetics and faster switching, such as Gallium Nitride switches, may support higher frequency converters. These higher frequency circuits may require control signals to be sent with more precise timing than for lower frequency circuits.

Driver circuitry 10 may deliver signals and/or voltages to the control terminals of transistors 4A, 4B, 6A, 6B, 8A, and 8B. Driver circuitry 10 may also include gate driver circuitry configured to translate lower-power control signals into higher-power control signals. In some examples, driver circuitry 10 may be integrated into the package with one or more of transistors 4A, 4B, 6A, 6B, 8A, and 8B, or driver circuitry 10 may be a separate IC. In some examples, driver circuitry 10 may be configured to deliver control signals such as pulse-width modulated (PWM) signals, pulse-density modulated (PDM) signals, and/or any other suitable control signals.

Half-bridge circuit 18 may include transistors 4A and 4B. Transistors 4A and 4B may be coupled to each other and to output node 16A. Half-bridge circuit 18 may produce one phase of an output voltage for device 2. Transistors 6A and 6B and transistor 8A and 8B may each produce other phases of the output voltage for device 2. In some examples, device 2 may include one or more H-bridge circuits, where each H-bridge circuit may include two half-bridge circuits. The switch node of the first half-bridge circuit of the H-bridge circuit may be electrically connected to a first side of an electrical load, and the switch node of the second half-bridge circuit of the H-bridge circuit may be electrically connected to a second side of the electrical load.

Figure 2:
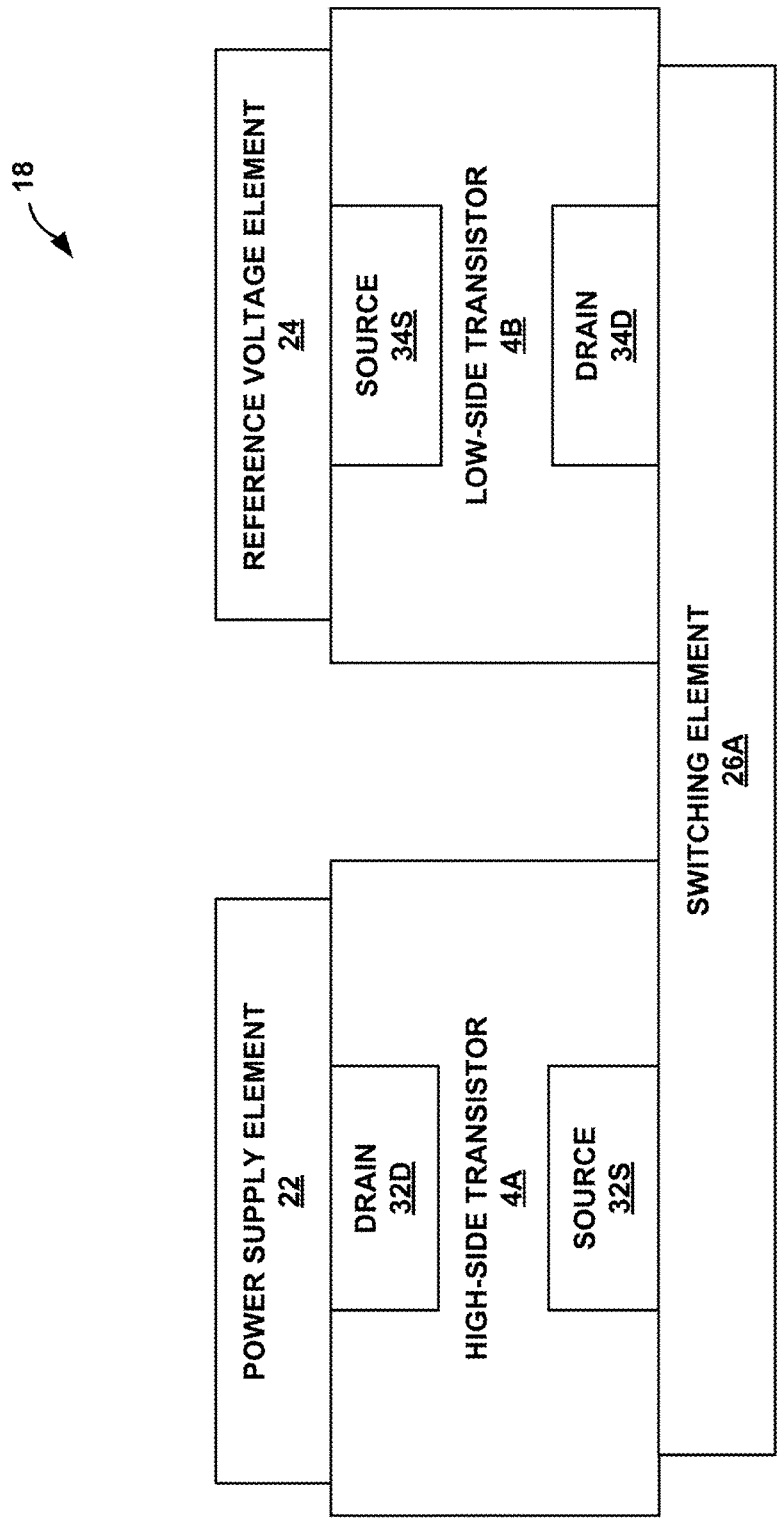
FIG. 2 is a side-view conceptual block diagram of the half-bridge circuit of FIG. 1, in accordance with some examples of this disclosure.

FIG. 2 is a side-view conceptual block diagram of half-bridge circuit 18, in accordance with some examples of this disclosure. One or both of transistors 4A and 4B may include a vertical transistor that is manufactured from silicon, silicon carbide, gallium nitride or any other suitable semiconductor. For a vertical transistor, the source terminal and the drain terminal may be on opposite sides or opposite surfaces of the transistor. Current in a vertical transistor may flow through the transistors from top to bottom or from bottom to top. The transistors of device 2 may be vertical FETs, such as vertical MOSFETs.

High-side transistor 4A may include two load terminals, such as source 32S and a drain 32D. Low-side transistor 4B may include two load terminals, such as source 34S and a drain 34D. Each of transistors 4A and 4B may include a control terminal such as a gate terminal (not shown in FIG. 2). Each of the control terminals and load terminals of transistors 4A and 4B may include a pad or area at a surface of transistor 4A or 4B to form external electrical connections.

Transistors 4A and 4B may be configured such that source 32S is electrically connected to drain 34D through switching element 26A. The switching elements of device 2 may be electrically connected to the source terminals of the high-side transistors and the drain terminals of the low-side transistors. Switching element 26A may be on an opposite side of transistors 4A and 4B from drain 32D and source 34S. In some examples, source 32S and drain 34D may be electrically connected through switching element 26A to an inductor and/or an electrical load (not shown in FIG. 2).

Switching element 26A, as well as the switching elements of FIGS. 3 and 5-7, may include a clip, a wire bond, a ribbon, a metallization layer, a die paddle, a wire bond, and/or any other suitable conductive material. If switching element 26A is a clip, switching element 26A may be a copper clip. If switching element 26A is a wire bond, switching element 26A may be an aluminum wire or a copper wire with solder paste or soft solder. If switching element 26A is a ribbon, switching element 26A may be an aluminum ribbon. Switching element 26A may operate in a similar manner to output node 16A in FIG. 1, such that the voltage level of switching element 26A may approach the voltage level of power supply element 22 when high-side transistor 4A is active. The voltage level of switching element 26A may approach the voltage level of reference voltage element 22 when low-side transistor 4B is active.

Power supply element 22 and reference voltage element 24 may include die paddles, metallization layers, leadframe segments, and/or any other suitable conductive material. Elements 22 and 24 may be called slugs, such that FIG. 2 depicts a "slug-up" configuration in which elements 22 are position on top of transistors 4A and 4B. A slug-up configuration may allow electrical connections and a thermal path on the top of the device.

Power supply element 22 may be electrically connected to drain 32D and to a high-side power supply. Power supply element 22 may be electrically connected to the drain terminals of all of the high-side transistors of device 2. Power supply element 22 may operate as a high-side voltage rail in a similar manner to input node 12 in FIG. 1. Power supply element 22 may deliver electricity from power supply to the high-side load terminals of transistors 4A, 6A, and 8A.

Reference voltage element 24 may be electrically connected to source 34S and to a low-side power supply. Reference voltage element 24 may be electrically connected to the source terminals of all of the low-side transistors of device 2. Reference voltage element 24 may operate as a low-side voltage rail in a similar manner to reference node 14 in FIG. 1. Reference voltage element 24 may deliver electricity from power supply to the low-side load terminals of transistors 4B, 6B, and 8B. Power supply element 22 may be electrically isolated from reference voltage element 24.

Figure 3:
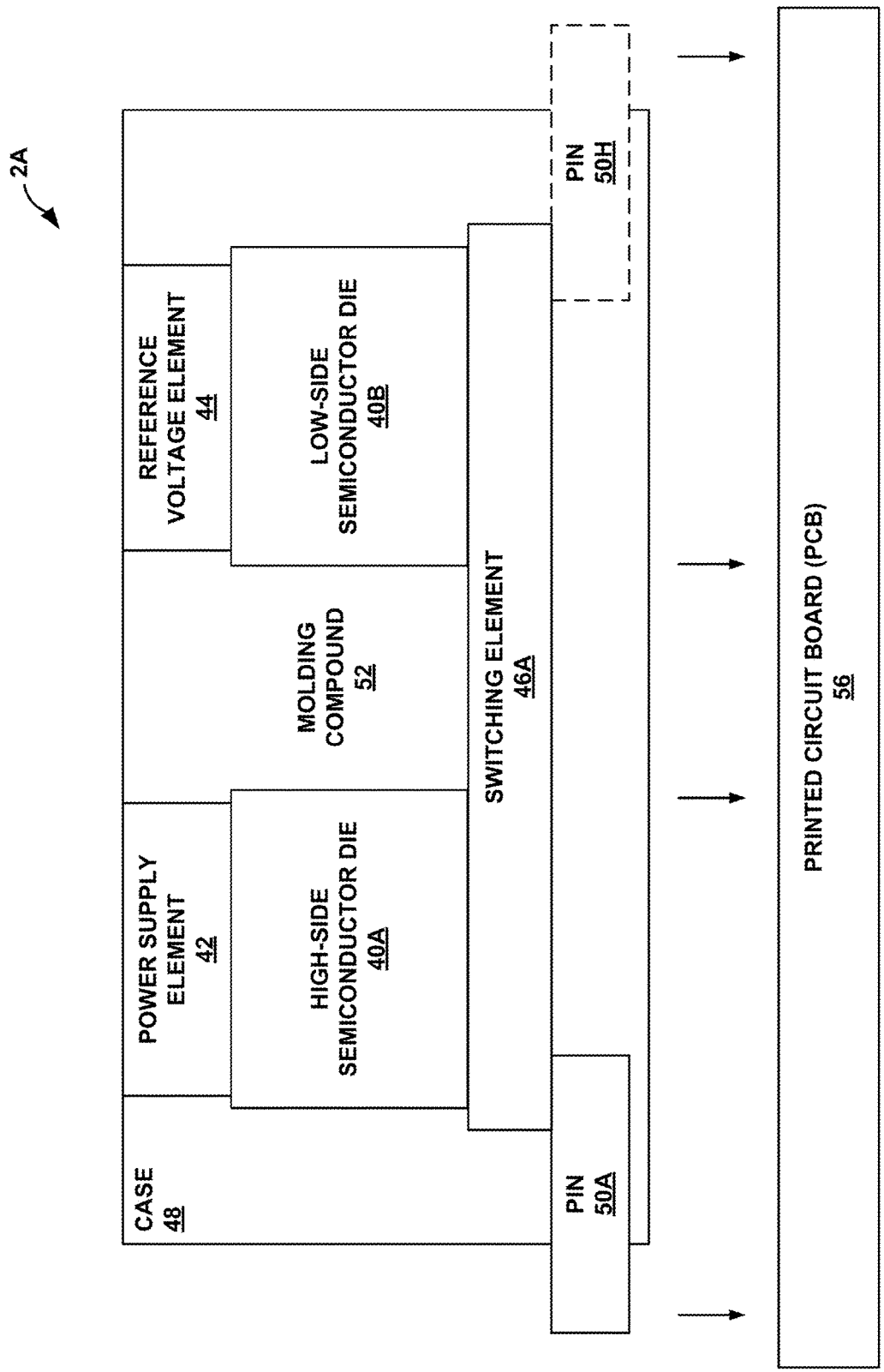
FIG. 3 is a side-view conceptual block diagram of an example device of FIG. 1, in accordance with some examples of this disclosure.

FIG. 3 is a side-view conceptual block diagram of an example device 2A, in accordance with some examples of this disclosure. Device 2A may include a slug-up configuration, where elements 42 and 44 are position on top of semiconductor die 40A and 40B. The bottom side of device 2A may be configured to mount on PCB 56. Elements 42 and 44 may not be configured to mount of PCB 56.

Case 48 may encapsulate semiconductor die 40A and 40B and switching element 46A. Case 48 may also encapsulate the other switching elements of device 2A and molding compound 52. Case 48 may at least partially encapsulate power supply element 42 and reference voltage element 44, such that elements 42 and 44 may be partially exposed on the top side of device 2A. For a slug-up configuration, the case 48 may encapsulate the components of device 2A, except for the partially exposed elements 42 and 44 and pins 50A and 50H. Case 48 may include plastic, ceramic, metal, and/or any other suitable material. Case 48 may also be called a housing, package, or enclosure.

Pin 50A and optional pin 50H may extend through case 48. Switching element 46A may be electrically connected to pin 50A and optionally to pin 50H. In some examples, switching element 46A may be electrically connected to only one pin, such as pin 50A. Alternatively, switching element 46A may be electrically connected to two or more pins, such as pins 50A, pin 50H, and/or any other pins. Pin 50A and optional pin 50H may be positioned on case 48 such that the bottom side of the case is configured to mount on PCB 56 and such that pin 50A and optional pin 50H are configured to mount on PCB 56. Pin 50A and optional pin 50H may be positioned at or near the bottom side of case 48 such that pin 50A and optional pin 50H may be electrically connected to trace(s) and/or pad(s) on PCB 56.

Molding compound 52 may encapsulate semiconductor die 40A and 40B. Molding compound may at least partially encapsulate switching element 46A and the other switching elements of device 2A. Molding compound 52 may comprise a semi solid or a moldable solid that covers, forms around, and/or secures semiconductor die 40A and 40B, elements 42 and 44, switching element 46A. Molding compound 52 may prevent or impede the conduction of electricity between high-side semiconductor die 40A and low-side semiconductor die 40B. Molding compound 52 may include any suitable insulating material, such as silica-filled epoxy molding compound (EMC), epoxy encapsulation material, and/or any other suitable material. Molding compound 52 may be a thermoset material.

In some examples, the deposition of molding compound 52 may be referred to as "over-molding." Molding compound 52 may flow into and fill the space between the components of device 2A to secure the components. The filler size or particle size in molding compound 52 may be small enough small enough to fit in the space between semiconductor die 40A and 40B and between elements 42 and 44. In some examples, molding compound 52 may comprise encapsulating material or epoxy molding compound. In some examples, the fabrication process may include liquid underfill or anisotropic tape with conductive film for the space between semiconductor die 40A and 40B and between elements 42 and 44.

In some examples, device 2A may be assembled in the following manner. First, a bottom side of high-side semiconductor die 40A may be electrically connected to a top side of power supply element 42. Next, a bottom side of low-side semiconductor die 40B may be electrically connected to a top side of reference voltage element 44. Semiconductor die 40A and 40B may be electrically connected to elements 42 and 44 in any suitable manner, such as soldering, diffusion soldering, sintering, gluing, and/or fusion bonding. Switching element 46A and the other switching elements may then be electrically connected to a top side of semiconductor die 40A and 40B. The process of connecting an integrated semiconductor die may be faster and less complex than the process of connecting discrete transistors.

Next, molding compound 52 may be deposited around the components of device 2A. The components of device 2A may be flipped upside down and switching element 46A may be electrically connected to pin 50A and optionally to pin 50H. Case 48 may be attached to elements 42 and 44, molding compound 52, pin 50A and 50H, such that these components are encapsulated in case 48. Elements 42 and 44 may be partially encapsulated in case 48. Device 2A may then be mounted on PCB 56 by soldering, gluing, and/or any other suitable method of mounting device 2A on PCB 56. Pins 50A and 50H may be soldered to traces and/or pads in PCB 56.

In some examples, the electrical connections between the components of device 2A may be formed by soldering. In some examples, the solder may be lead-based solder. Soldering components to form electrical connections may include placing solder between the components, applying heat to melt the solder, and allowing the solder to cool to form the electrical connection. The soldering process may include double-sided reflow to form the electrical connections between the components of device 2A. The components of device 2A may also be glued or adhered together with conductive paste, conductive tape, conductive epoxy, and/or metal sintering. The connections between the components of device 2A may include metalized plated laser vias, solder, and/or high-pressure/high-frequency metalized bonding such as diffusion bonding. Diffusion bonding may include direct bonding between the components of device 2A.

Device 2A may include additional components not shown in FIG. 3, such as driver circuitry configured to deliver control signals. Device 2A may also include wire bonds electrically connected to the control terminals of the transistors of semiconductor die 40A and 40B. In some examples, device 2A may also include thermally conductive material configured to operate as a heat sink.

Figure 4A:
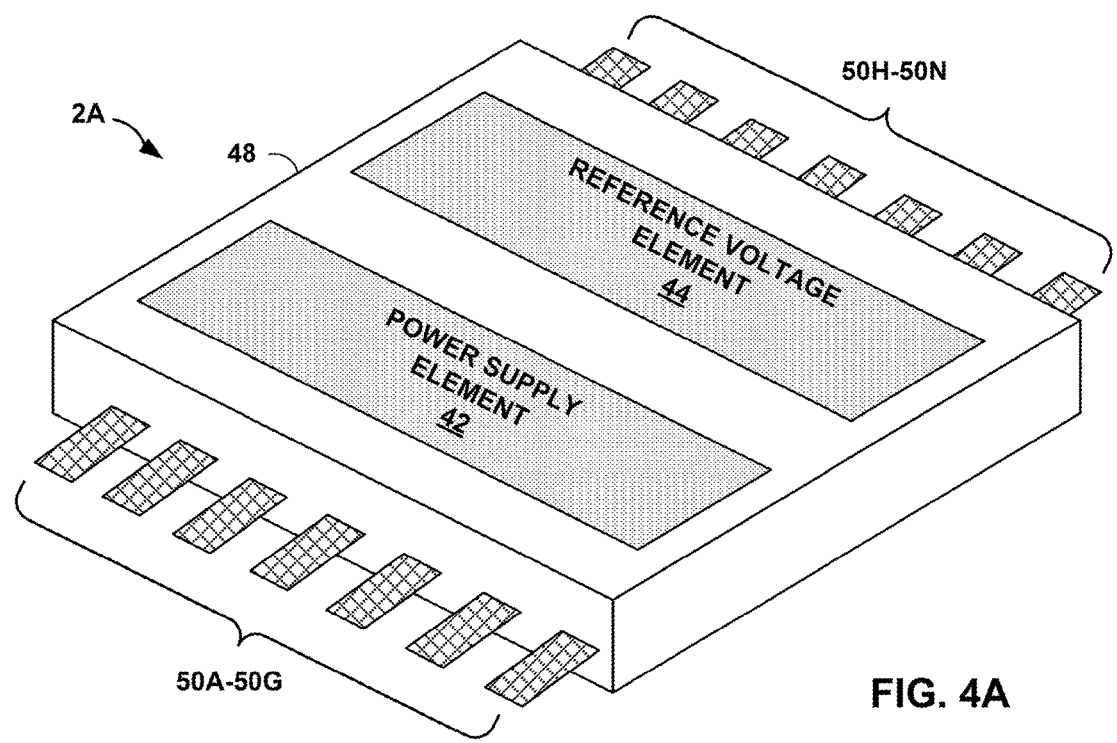
FIGS. 4A and 4B are top- and bottom-view diagrams of the device of FIG. 3, in accordance with some examples of this disclosure.
Figure 4B:
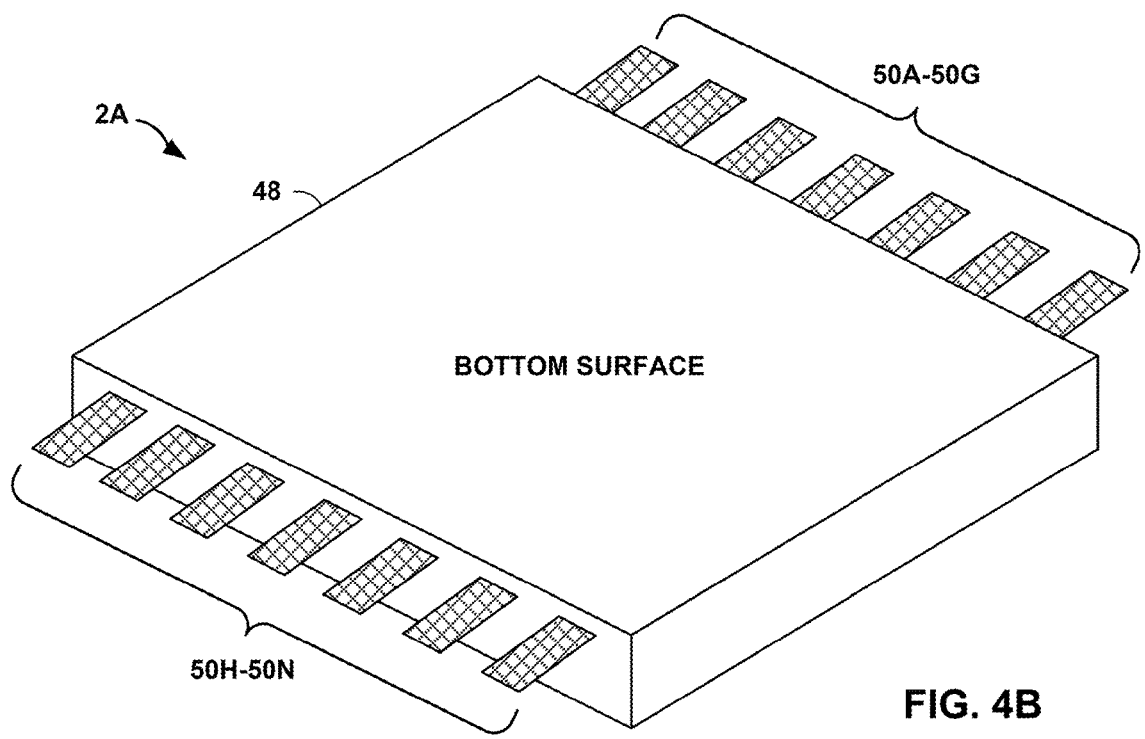

FIGS. 4A and 4B are top- and bottom-view diagrams of device 2A, in accordance with some examples of this disclosure. FIG. 4A is a top-view diagram of device 2A, which may include a slug-up configuration with elements 42 and 44 at least partially exposed on the top side of case 48. Pins 50A-50N may be arrayed on the sides of case 48 near the bottom side of case 48. FIG. 4B is a bottom-view diagram of device 2A, showing the bottom side of case 48. The bottom surface of case 48 may be configured to mount on a PCB. Pins 50A-50N may be configured to electrically connected to traces and/or pads on the PCB.

Case 48 is depicted as rectangular with pins 50A-50N. In some examples, device 2A may be surface-mount technology, and each of pins 50A-50N may include a lead. In some examples, case 48 may include a dual in-line package (DIP), a small outline integrated circuit (SOIC), a power quad flat no-lead (PQFN) package, a TO (transistor-outline)-263 or TO-220 package (also known as DPAK), and/or any other suitable package.

Pins 50A-50N may extend through case 48 and may be configured to provide electrical connections between the components of device 2A and external components. If device 2A is a three-phase device, three of pins 50A-50N may be electrically connected to switching elements 46A-46C. Six of pins 50A-50N may be electrically connected to the control terminals of each of the transistors of semiconductor die 40A and 40B. In some examples, two of pins 50A-50N may be electrically connected to temperature sensors inside case 48.

In some examples, elements 42 and 44 may not be electrically connected to pins 50A-50N. One of elements 42 and 44 may include an electrical connection to another device at the exposed surface of the respective one of elements 42 and 44. In some examples, one or both of elements 42 and 44 may be electrically connected to one or more of pins 50A-50N in addition to or in the alternative to the exposed surfaces of elements 42 and 44. Elements 42 and 44 may be electrically connected to one or more of pins 50A-50N if device 2A includes a slug-down configuration.

Figure 5:
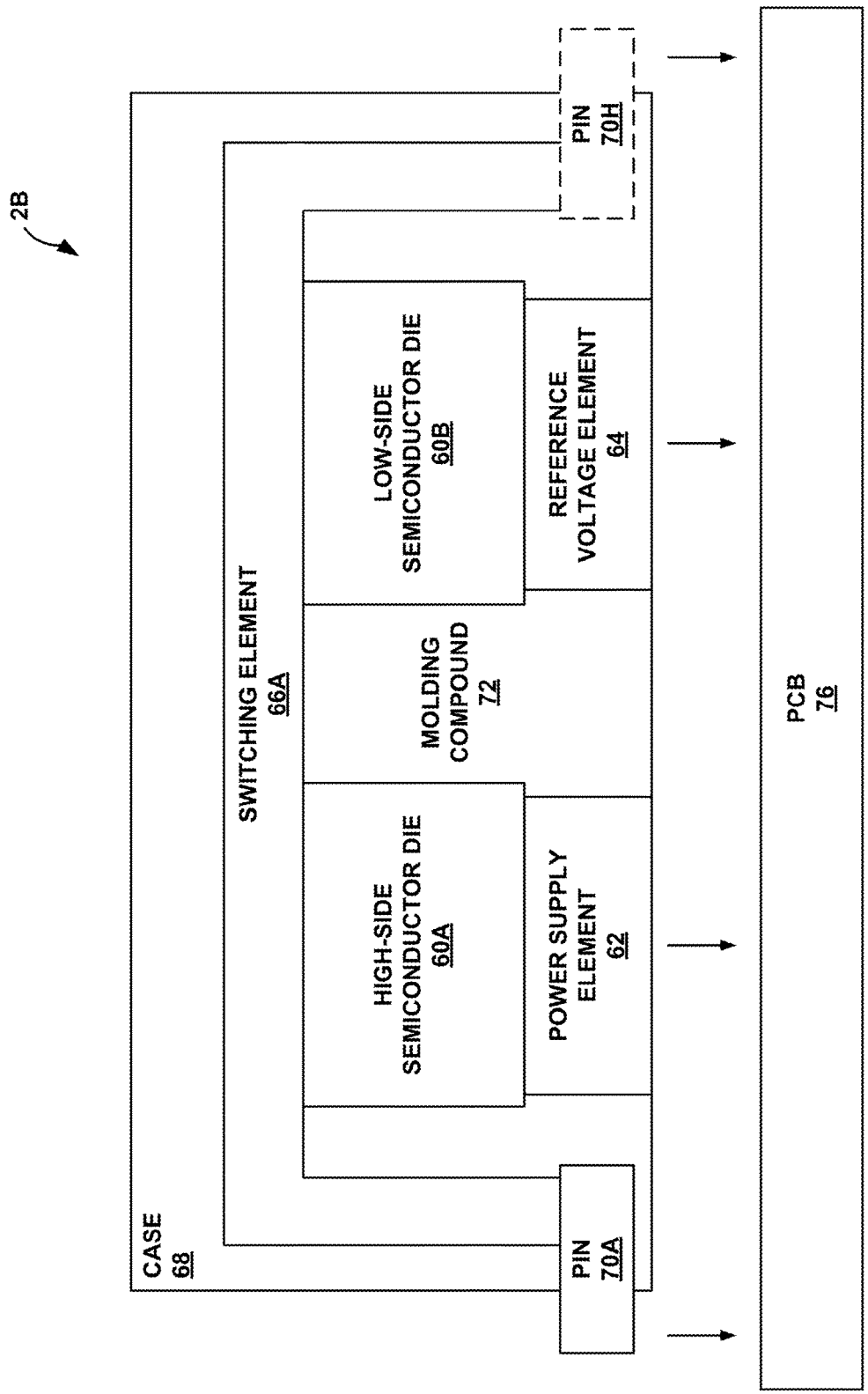
FIG. 5 is a side-view conceptual block diagram of another example device of FIG. 1, in accordance with some examples of this disclosure.

FIG. 5 is a side-view conceptual block diagram of another example device 2B, in accordance with some examples of this disclosure. Device 2B may include a "slug-down" configuration, where elements 62 and 64 are called slugs and are position beneath semiconductor die 60A and 60B. The bottom side of device 2B may be configured to mount on PCB 76, such that elements 62 and 64 may be configured to mount on PCB 76 and electrically connect to traces and/or pads in PCB 76. Switching element 66A may include a "C" shape, as depicted in FIG. 5, or switching element 66A may be mounted on pillars that are connected to pins 70A and 70H and switching element 66A.

In some examples, the assembly process of device 2B may include connecting semiconductor die 60A and 60B on top of switching element 66A, connecting elements 62 and 64 on top of semiconductor die 60A and 60B, depositing molding compound 72, and flipping device 2B. Thus, device 2B may be called a flip chip.

Figure 6:
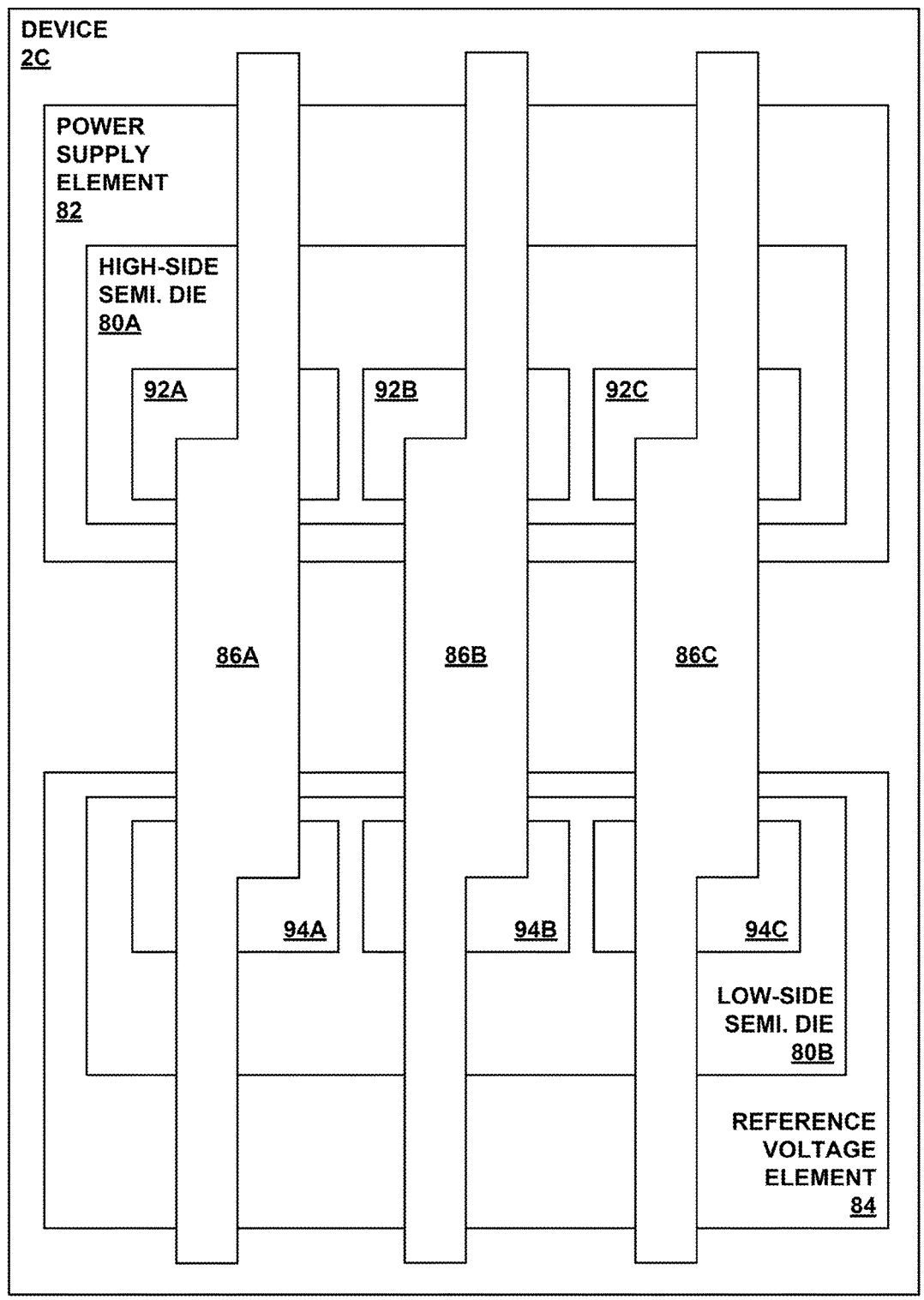
FIG. 6 is a top-view conceptual block diagram of another example device of FIG. 1, in accordance with some examples of this disclosure.

FIG. 6 is a top-view conceptual block diagram of another example device 2C, in accordance with some examples of this disclosure. Device 2C includes switching elements 86A-86C connected across transistors 92A-92C and 94A-94C in semiconductor die 80A and 80B. FIG. 6 depicts switching elements 86A-86C as metal clips and/or metal layers (see FIG. 7 for depiction of switching elements as wire bonds).

Semiconductor die 80A may be positioned on top of power supply element 82, and semiconductor die 80B may be positioned on top of reference voltage element 84. Although FIG. 6 depicts device 2C as including three phases, device 2C may include two, three, four, or more than four phases, in some examples. In some examples, the first phase of device 2C may include switching element 86A and transistors 92A and 94A, the second phase of device 2C may include switching element 86B and transistors 92B and 94B, and the third phase of device 2C may include switching element 86C and transistors 92C and 94C.

High-side transistors 92A-92C may be integrated in high-side semiconductor die 80A. Low-side transistors 94A-94C may be integrated in low-side semiconductor die 82A. By integrating each of high-side transistors 92A-92C and low-side transistors 94A-94C into a single semiconductor die, the volume taken up by high-side transistors 92A-92C may be reduced, as compared to three discrete high-side transistors. In addition, the time and complexity of assembling device 2C may be lower than the time and complexity of assembling a multiphase device including discrete transistors. Lower time and effort may result in lower cost for device 2C, as compared to a multiphase device including discrete transistors.

Each of switching elements 86A-86C may be electrically connected to one or more pins (not shown in FIG. 6). In accordance with the techniques of this disclosure, each of switching elements 86A-86C may include a pin that extends through the case of device 2C. The pin may be an integrated pin, such that the pin and the respective one of switching elements 86A-86C are a single component.

Figure 7:
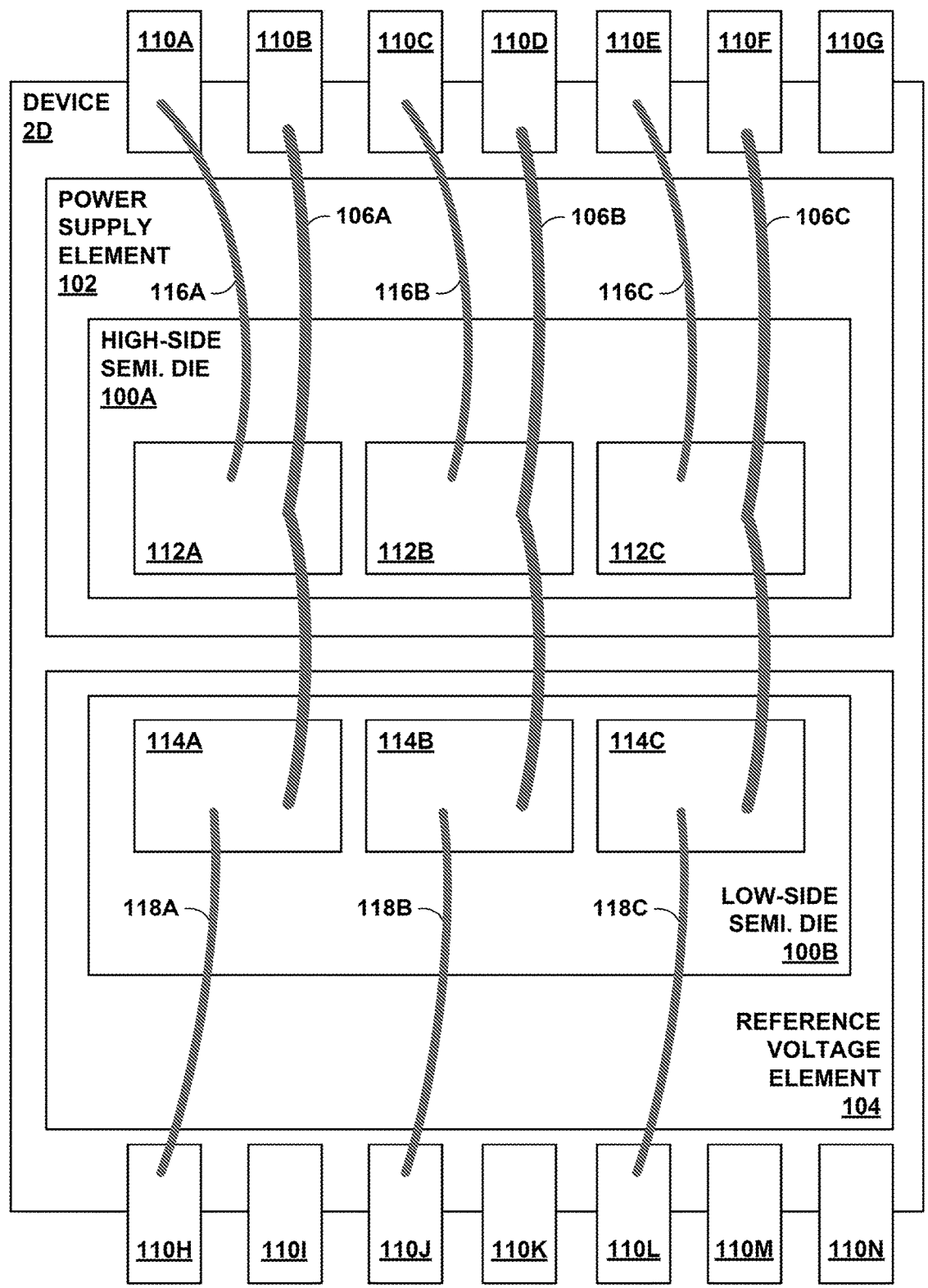
FIG. 7 is a top-view conceptual block diagram of another example device of FIG. 1, in accordance with some examples of this disclosure.

FIG. 7 is a top-view conceptual block diagram of another example device 2D, in accordance with some examples of this disclosure. Device 2D may include a slug-down configuration such that elements 102 and 104 are at least partially exposed on a bottom side of device 2D. Device 2D may include switching elements 106A-106C, illustrates as wire bonds in FIG. 7. In some examples, switching elements 106A-106C may include aluminum wire, aluminum ribbon, and/or copper wire. Each of switching elements 106A-106C may be electrically connected to a load terminal of one of transistors 112A-112C and to a load terminal of one of transistors 114A-114C. Each of switching elements 106A-106C may be electrically connected to one of pins 110B, 110D, and 110F, such that switching elements 106A-106C and/or pins 110B, 110D, and 110F may be configured to operate as output nodes of device 2D.

Wire bonds 116A-116C and 118A-118C may include aluminum wire, aluminum ribbon, and/or copper wire. Each of wire bonds 116A-116C and 118A-118C may be electrically connected to a control terminal, such as a gate terminal, of one of transistors 112A-112C and 114A-114C. Each of wire bonds 116A-116C and 118A-118C may also be electrically connected to one of pins 110A, 110C, 110E, 110H, 110J, and 110L.

Figure 8B:
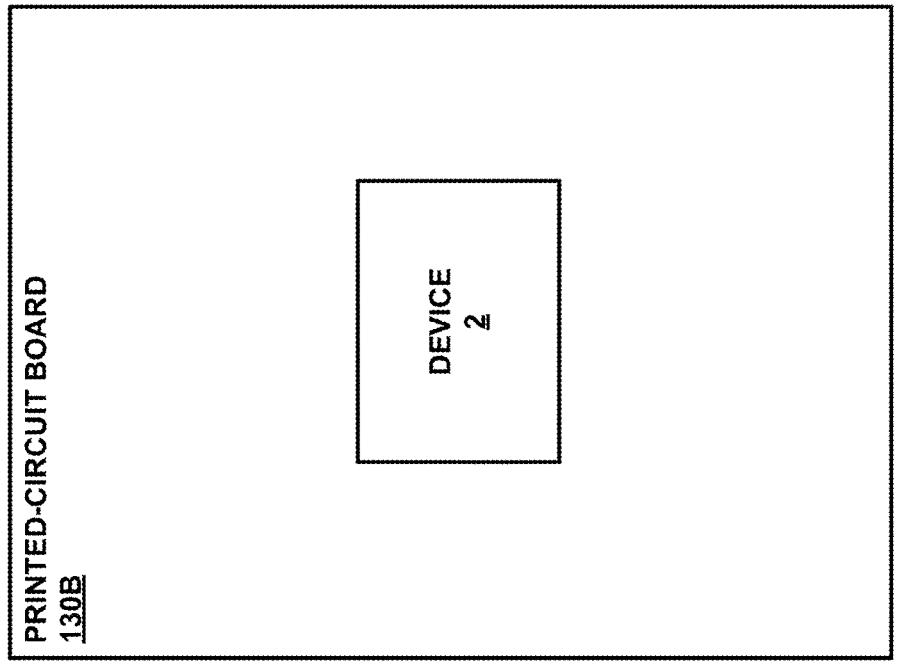
FIGS. 8A and 8B are top-view diagrams of two printed circuit boards.
Figure 8A:
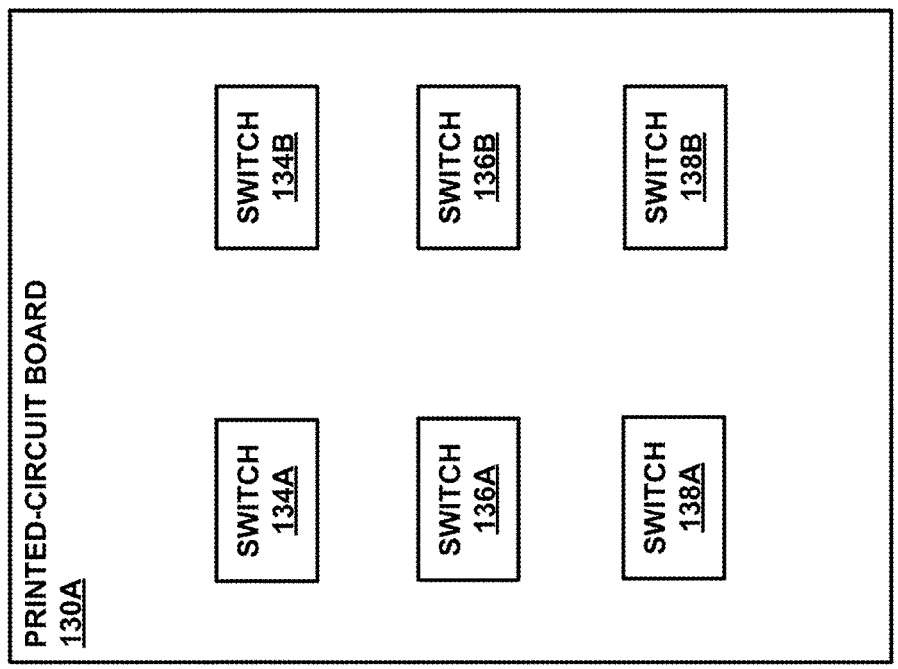

FIGS. 8A and 8B are top-view diagrams of two printed circuit boards 130A and 130B. FIG. 8A depicts a layout of switches 134A, 134B, 136A, 136B, 138A, and 138B on PCB 130A. FIG. 8B depicts a layout of device 2 on PCB 130B. The size and footprint of device 2 on PCB 130B is smaller than the size and footprint of switches 134A, 134B, 136A, 136B, 138A, and 138B on PCB 130A. By using transistors integrated into semiconductor die in device 2, device 2 may include a smaller package than discrete switches in a single package and a smaller layout than separate packages for each of switches 134A, 134B, 136A, 136B, 138A, and 138B. Integrating the components of device 2 into a single device may reduce the effort for the customer to assemble a PCB device, as compared to assembling a PCB device including switches 134A, 134B, 136A, 136B, 138A, and 138B.

Figure 9:
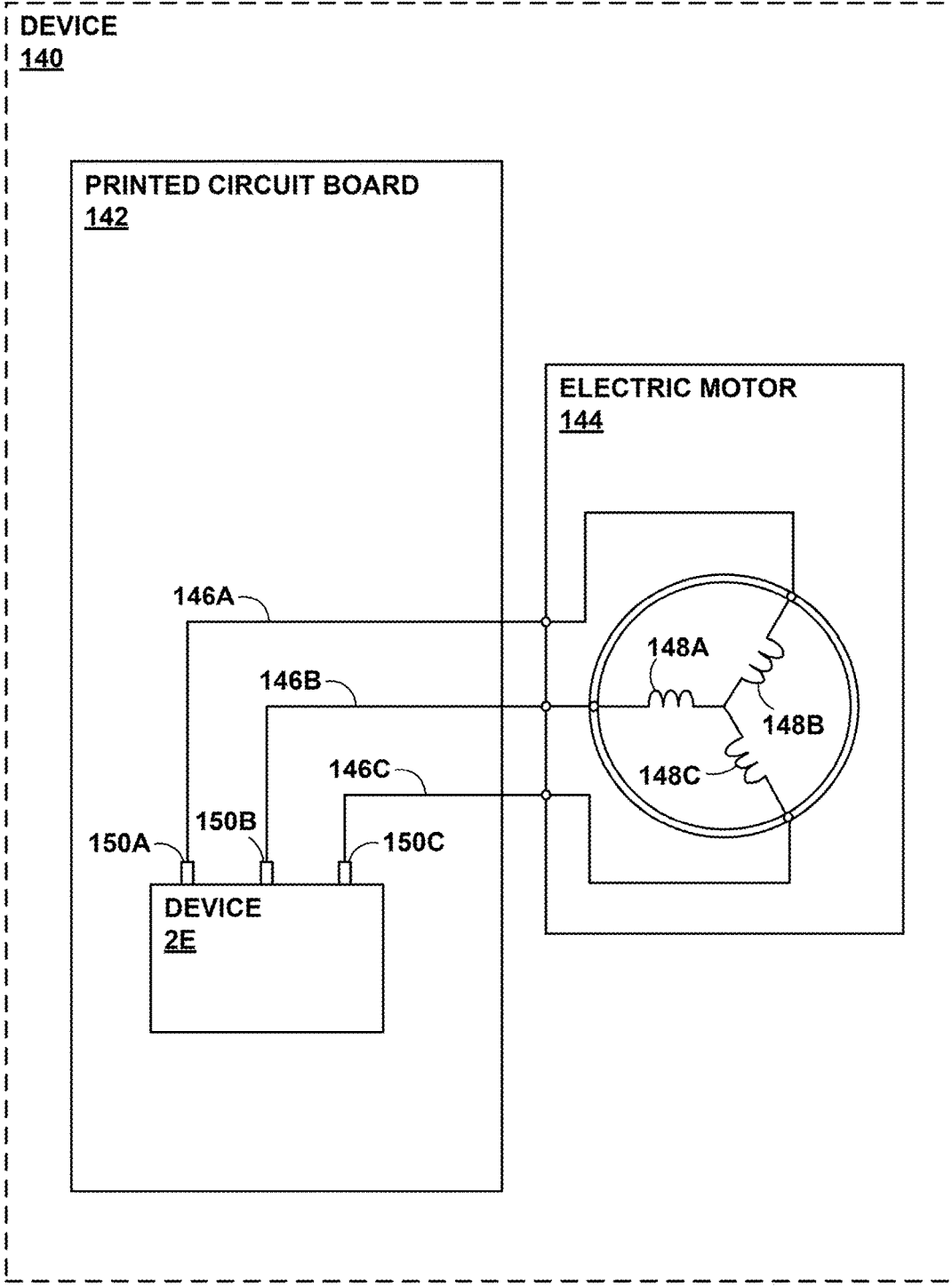
FIG. 9 is conceptual block diagram of an example application for another example device of FIG. 1, in accordance with some examples of this disclosure.

FIG. 9 is conceptual block diagram of an example application for another example device 2E, in accordance with some examples of this disclosure. In this example application, device 2E may be a motor driver circuit for electric motor 144. Electric motor 144 may include two or more phases. As depicted in FIG. 9, device 2 and electric motor 144 include three phases.

Device 2E includes pins 150A-150C, each of which may be electrically connected to switching elements inside device 2E. Connections 146A-146C may deliver output signals from pins 150A-150C to coils 148A-148C of electric motor 144. In some examples, coils 148A-148C may be rotor coils in the rotor of electric motor 144. Additionally or alternatively, coils 148A-148C may be stator coils in the stator of electric motor 144.

Connections 146A-146C may include traces in PCB 142. Device 2E may be mounted on PCB 142, and pins 150A-150C may be soldered to the traces and/or pads of PCB 142. Connections 146A-146C may also include wires to deliver the output signals from the traces in PCB 142 to coils 148A-148C of electric motor 144. Each of the switching elements of device 2 may be electrically connected to a respective one of coils 148A-148C through a respective one of connections 146A-146C.

Figure 10:
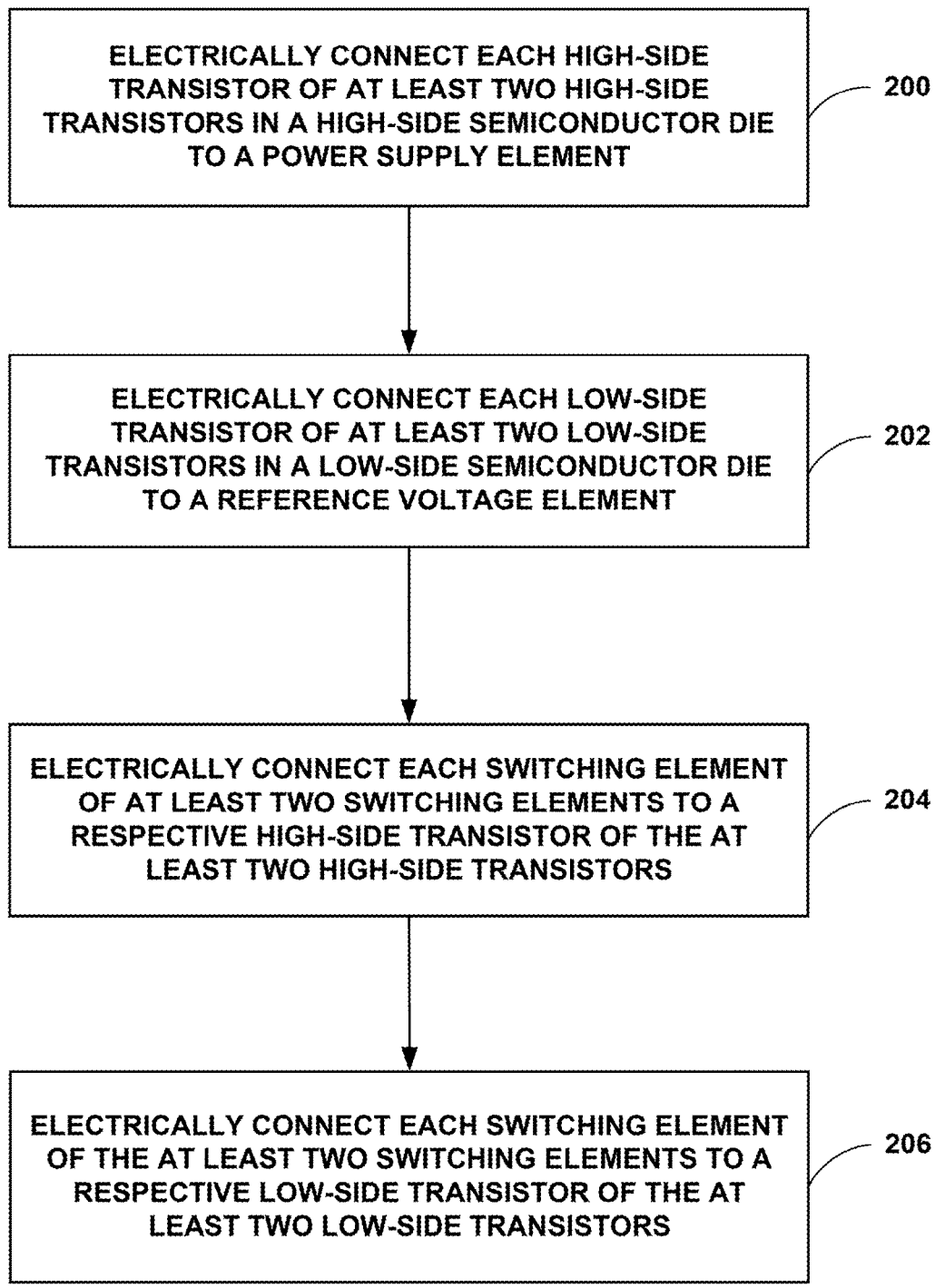
FIG. 10 is a flowchart illustrating an example technique for assembling a semiconductor device, in accordance with some examples of this disclosure.

FIG. 10 is a flowchart illustrating an example technique 200 for assembling a semiconductor device, in accordance with some examples of this disclosure. Technique 200 is described with reference to device 2C in FIG. 6, although other components, such as devices 2, 2A, 2B, and 2D in FIGS. 1, 3-5, 7, and 8B, may exemplify similar techniques.

The technique of FIG. 10 includes electrically connecting each of high-side transistors 92A-92C in high-side semiconductor die 80A to power supply element 82 (200). The technique of FIG. 10 further includes electrically connecting each of low-side transistors 94A-94C in low-side semiconductor die 80B to reference voltage element 84, wherein reference voltage element 84 is electrically isolated from power supply element 82 (202). Solder material or paste may be applied to the high-side load terminal of each of transistors 92A-92C, and semiconductor die 80A may be positioned on top of power supply element 82. Solder material or paste may also be applied to the low-side load terminal of each of transistors 94A-94C, and semiconductor die 80B may be positioned on top of reference voltage element 84. The connections between semiconductor die 80A and 80B and elements 82 and 84 may be made by soldering, diffusion bonding, pasting, gluing, and/or any other suitable method.

The technique of FIG. 10 further includes electrically connecting each of switching elements 86A-86C to a respective one of high-side transistors 92A-92C (204). The technique of FIG. 10 further includes electrically connecting each of switching elements 86A-86C to a respective one of low-side transistors 94A-94C (206). If each of switching elements 86A-86C includes a clip, solder paste may be applied to the low-side load terminal of each of transistors 92A-92C and the high-side load terminal of each of transistors 94A-94C, and switching elements 86A-86C may be positioned on top of transistors 92A-92C and 94A-94C. The connection between semiconductor die 80A and 80B and switching elements 86A-86C may be formed by a reflow process. If each of switching elements 86A-86C includes a wire bond, the wire bonding may occur by soldering.

The assembly of device 2C may include electrically connecting each of switching elements 86A-86C to one or more pins. The assembly of device 2C may optionally include electrically connecting the control terminals of the transistors in semiconductor die 80A and 80B to one or more pins by, for example, wire bonding.

The assembly of device 2C may optionally include encapsulating semiconductor die 80A and 80B in molding compound and at least partially encapsulating elements 82 and 84 in molding compound. The assembly may include encapsulating semiconductor die 80A and 80B and switching elements 86A-86C in a case. After attaching the case, elements 82 and 84 may be at least partially exposed on the case as an exposed slug or exposed pad. Elements 82 and 84 may include conductive material that is at least partially exposed on the surface of device 2C. If device 2C includes a slug-up configuration, the process may include flipping device 2C after electrically connecting switching elements 86A-86C.

The following numbered examples demonstrate one or more aspects of the disclosure.

Example 1

A device includes a power supply element and a reference voltage element, wherein the reference voltage element is electrically isolated from the power supply element. The device further includes a high-side semiconductor die including at least two high-side transistors, wherein each high-side transistor of the at least two high-side transistors is electrically connected to the power supply element. The device also includes a low-side semiconductor die including at least two low-side transistors, wherein each low-side transistor of the at least two low-side transistors is electrically connected to the reference voltage element. The device includes at least two switching elements, wherein each switching element of the at least two switching elements is electrically connected to a respective high-side transistor of the at least two high-side transistors and to a respective low-side transistor of the at least two low-side transistors.

Example 2

The device of example 1, further including a molding compound, wherein the molding compound encapsulates the high-side semiconductor die and the low-side semiconductor die; and the molding compound at least partially encapsulates the at least two switching elements.

Example 3

The device of examples 1-2 or any combination thereof, further including a case, wherein the case encapsulates the high-side semiconductor die, the low-side semiconductor die, and at least two switching elements; and the case at least partially encapsulates the power supply element and the reference voltage element.

Example 4

The device of examples 1-3 or any combination thereof, further including at least two pins extending through the case, wherein each switching element of the at least two switching elements is electrically connected to a respective pin of the at least two pins, and wherein the at least two pins are positioned on the case such that a first side of the case is configured to mount on a printed circuit board (PCB) and such that the at least two pins are configured to mount on the PCB.

Example 5

The device of examples 1-4 or any combination thereof, wherein the power supply element and the reference voltage element are exposed on the first side of the case and configured to mount on the PCB.

Example 6

The device of examples 1-5 or any combination thereof, wherein the power supply element and the reference voltage element are exposed on a second side of the case and not configured to mount on the PCB.

Example 7

The device of examples 1-6 or any combination thereof, wherein a control terminal of each high-side transistor of the at least two high-side transistors is electrically connected to a respective pin of the at least two pins. A control terminal of each low-side transistor of the at least two low-side transistors is electrically connected to a respective pin of the at least two pins.

Example 8

The device of examples 1-7 or any combination thereof, wherein each switching element of the at least two switching elements includes a pin extending through the case.

Example 9

The device of examples 1-8 or any combination thereof, wherein the power supply element includes a conductive material that is at least partially exposed on a surface of the device. The reference voltage element includes the conductive material that is at least partially exposed on a surface of the device.

Example 10

The device of examples 1-9 or any combination thereof, wherein each switching element of the at least two switching elements includes a copper clip, an aluminum ribbon, or a wire bond.

Example 11

The device of examples 1-10 or any combination thereof, wherein each high-side transistor of the at least two high-side transistors is a vertical high-side field-effect transistor (FET). Each low-side transistor of the at least two low-side transistors is a vertical low-side FET. A drain terminal of each high-side transistor of the at least two high-side transistors of the high-side semiconductor die is electrically connected to the power supply element. A source terminal of each high-side transistor of the at least two high-side transistors of the high-side semiconductor die is electrically connected to a respective switching element of the at least two switching elements. A drain terminal of each low-side transistor of the at least two low-side transistors of the low-side semiconductor die is electrically connected to a respective switching element of the at least two switching elements. A source terminal of each low-side transistor of the at least two low-side transistors of the low-side semiconductor die is electrically connected to the reference voltage element.

Example 12

A method for assembling a semiconductor device, the method including electrically connecting each high-side transistor of at least two high-side transistors in a high-side semiconductor die to a power supply element. The method further includes electrically connecting each low-side transistor of at least two low-side transistors in a low-side semiconductor die to a reference voltage element, wherein the reference voltage element is electrically isolated from the power supply element. The method also includes electrically connecting each switching element of at least two switching elements to a respective high-side transistor of the at least two high-side transistors. The method also includes electrically connecting each switching element of at least two switching elements to a respective low-side transistor of the at least two low-side transistors.

Example 13

The method of example 12, further including encapsulating the high-side semiconductor die and the low-side semiconductor die in a molding compound. The method also includes at least partially encapsulating the at least two switching elements in the molding compound.

Example 14

The method of examples 12-13 or any combination thereof, further including electrically connecting each switching element of at least two switching elements to a respective pin of at least two pins. The method also includes encapsulating the high-side semiconductor die, the low-side semiconductor die, and at least two switching elements in a case. The method further includes at least partially encapsulating the power supply element, the reference voltage element, and the at least two pins in the case. The at least two pins are positioned on the case such that a first side of the case is configured to mount on a printed circuit board (PCB) and such that the at least two pins are configured to mount on the PCB.

Example 15

The method of examples 12-14 or any combination thereof, further including electrically connecting a control terminal of each high-side transistor of the at least two high-side transistors to a respective pin of the at least two pins. The method also includes electrically connecting a control terminal of each low-side transistor of the at least two low-side transistors to a respective pin of the at least two pins.

Example 16

The method of examples 12-15 or any combination thereof, wherein each switching element of the at least two switching elements includes an aluminum ribbon, a copper clip, or a wire bond.

Example 17

A device includes an electric motor including a stator including at least two stator coils and a rotor including at least two rotor coils. The device further includes a printed circuit board (PCB) including at least two traces and power conversion device mounted on the PCB, wherein the power conversion device includes a power supply element and a reference voltage element, wherein the reference voltage element is electrically isolated from the power supply element. The power conversion device also includes a high-side semiconductor die including at least two vertical high-side transistors, wherein each vertical high-side transistor of the at least two vertical high-side transistors is electrically connected to the power supply element. The power conversion device further includes a low-side semiconductor die including at least two vertical low-side transistors, wherein each vertical low-side transistor of the at least two vertical low-side transistors is electrically connected to the reference voltage element. The power conversion device includes at least two switching elements, wherein each switching element of the at least two switching elements is electrically connected to a respective vertical high-side transistor of the at least two vertical high-side transistors and to a respective vertical low-side transistor of the at least two vertical low-side transistors. Each switching element of the at least two switching elements is electrically connected through a respective trace of the at least two traces to a respective rotor coil of the at least two rotor coils or to a respective stator coil of the at least two stator coils.

Example 18

The device of example 17, wherein the power conversion device further includes a molding compound encapsulating the high-side semiconductor die and the low-side semiconductor die and at least partially encapsulating the at least two switching elements. The power conversion device also includes a case encapsulating the high-side semiconductor die, the low-side semiconductor die, the at least two switching elements, and the molding compound and at least partially encapsulating the power supply element and the reference voltage element.

Example 19

The device of examples 17-18 or any combination thereof, further including at least two pins extending through the case, wherein the at least two pins are configured to mount on the PCB, wherein each switching element of the at least two switching elements is electrically connected to the respective rotor coil or to the respective stator coil through a respective trace of the at least two traces and a respective pin of the at least two pins.

Example 20

The device of examples 17-19 or any combination thereof, wherein the PCB includes power supply circuitry and reference voltage circuitry, and wherein the power supply element and the reference voltage element are exposed on the case and configured to mount on the PCB. The power supply element is electrically connected to the power supply circuitry through a respective trace of the at least two traces. The reference voltage element is electrically connected to the reference voltage circuitry through a respective trace of the at least two traces.

Various examples of the disclosure have been described. Any combination of the described systems, operations, or functions is contemplated. These and other examples are within the scope of the following claims.

What is claimed is:
1. A device comprising:
a power supply element;
a reference voltage element, wherein the reference voltage element is electrically isolated from the power supply element;

a single high-side semiconductor die including at least two high-side transistors, wherein each high-side transistor of the at least two high-side transistors is integrated into the single high-side semiconductor die, wherein each high-side transistor of the at least two high-side transistors is electrically connected to the power supply element;

a single low-side semiconductor die including at least two low-side transistors, wherein each low-side transistor of the at least two low-side transistors is integrated into the single low-side semiconductor die, wherein each low-side transistor of the at least two low-side transistors is electrically connected to the reference voltage element; and at least two switching elements, wherein each switching element of the at least two switching elements is directly electrically connected to a respective high-side transistor of the at least two high-side transistors, and wherein each switching element is directly electrically connected to a respective low-side transistor of the at least two low-side transistors.

2. The device of claim 1, further comprising a molding compound, wherein:
the molding compound encapsulates the single high-side semiconductor die and the single low-side semiconductor die; and
the molding compound at least partially encapsulates the at least two switching elements.

3. The device of claim 1, further comprising a case, wherein:
the case encapsulates the single high-side semiconductor die, the single low-side semiconductor die, and at least two switching elements; and
the case at least partially encapsulates the power supply element and the reference voltage element.

4. The device of claim 3, further comprising at least two pins extending through the case, wherein each switching element of the at least two switching elements is electrically connected to a respective pin of the at least two pins, and wherein the at least two pins are positioned on the case such that a first side of the case is configured to mount on a printed circuit board (PCB) and such that the at least two pins are configured to mount on the PCB.

5. The device of claim 4, wherein the power supply element and the reference voltage element are exposed on the first side of the case and configured to mount on the PCB.

6. The device of claim 4, wherein the power supply element and the reference voltage element are exposed on a second side of the case and not configured to mount on the PCB.

7. The device of claim 4, wherein:
a control terminal of each high-side transistor of the at least two high-side transistors is electrically connected to a respective pin of the at least two pins; and
a control terminal of each low-side transistor of the at least two low-side transistors is electrically connected to a respective pin of the at least two pins.

8. The device of claim 3, wherein each switching element of the at least two switching elements includes a pin extending through the case.

9. The device of claim 1, wherein:
the power supply element includes a conductive material that is at least partially exposed on a surface of the device; and
the reference voltage element includes the conductive material that is at least partially exposed on a surface of the device.

10. The device of claim 1,
wherein each switching element of the at least two switching elements comprises a copper clip, an aluminum ribbon, or a wire bond,
wherein each switching element of the at least two switching elements is directly electrically connected, by solder, to the respective high-side transistor of the at least two high-side transistors, and
wherein each switching element is directly electrically connected, by solder, to the respective low-side transistor of the at least two low-side transistors.

11. The device of claim 1, wherein:
each high-side transistor of the at least two high-side transistors is a vertical high-side field-effect transistor (FET);
each low-side transistor of the at least two low-side transistors is a vertical low-side FET;
a drain terminal of each high-side transistor of the at least two high-side transistors of the single high-side semiconductor die is electrically connected to the power supply element;
a source terminal of each high-side transistor of the at least two high-side transistors of the single high-side semiconductor die is electrically connected to a respective switching element of the at least two switching elements;
a drain terminal of each low-side transistor of the at least two low-side transistors of the single low-side semiconductor die is electrically connected to a respective switching element of the at least two switching elements; and
a source terminal of each low-side transistor of the at least two low-side transistors of the single low-side semiconductor die is electrically connected to the reference voltage element.

12. A method for assembling a semiconductor device, the method comprising:
electrically connecting each high-side transistor of at least two high-side transistors in a single high-side semiconductor die to a power supply element, wherein each high-side transistor of the at least two high-side transistors is integrated into the single high-side semiconductor die;
electrically connecting each low-side transistor of at least two low-side transistors in a single low-side semiconductor die to a reference voltage element, wherein each low-side transistor of the at least two low-side transistors is integrated into the single low-side semiconductor die, wherein the reference voltage element is electrically isolated from the power supply element;
electrically connecting each switching element of at least two switching elements directly to a respective high-side transistor of the at least two high-side transistors; and
electrically connecting each switching element of at least two switching elements directly to a respective low-side transistor of the at least two low-side transistors.

13. The method of claim 12, further comprising:
encapsulating the single high-side semiconductor die and the single low-side semiconductor die in a molding compound; and
at least partially encapsulating the at least two switching elements in the molding compound.

14. The method of claim 12, further comprising:
electrically connecting each switching element of at least two switching elements to a respective pin of at least two pins;

encapsulating the single high-side semiconductor die, the single low-side semiconductor die, and at least two switching elements in a case; and at least partially encapsulating the power supply element, the reference voltage element, and the at least two pins in the case, wherein the at least two pins are positioned on the case such that a first side of the case is configured to mount on a printed circuit board (PCB) and such that the at least two pins are configured to mount on the PCB.

15. The method of claim 14, further comprising:

electrically connecting a control terminal of each high-side transistor of the at least two high-side transistors to a respective pin of the at least two pins; and electrically connecting a control terminal of each low-side transistor of the at least two low-side transistors to a respective pin of the at least two pins.

16. The method of claim 12, wherein each switching element of the at least two switching elements comprises an aluminum ribbon, a copper clip, or a wire bond, wherein electrically connecting each switching element of at least two switching elements directly to the respective high-side transistor comprises soldering each switching element of at least two switching elements to the respective high-side transistor, and wherein electrically connecting each switching element of at least two switching elements directly to the respective low-side transistor comprises soldering each switching element of at least two switching elements to the respective low-side transistor.

17. A device comprising:

an electric motor including a stator including at least two stator coils and a rotor including at least two rotor coils;

a printed circuit board (PCB) including at least two traces; and power conversion device mounted on the PCB, wherein the power conversion device includes:

a power supply element;

a reference voltage element, wherein the reference voltage element is electrically isolated from the power supply element;

a single high-side semiconductor die including at least two vertical high-side transistors, wherein each vertical high-side transistor of the at least two vertical high-side transistors is integrated into the single high-side semiconductor die, wherein each vertical high-side transistor of the at least two vertical high-side transistors is electrically connected to the power supply element;

a single low-side semiconductor die including at least two vertical low-side transistors, wherein each vertical low-side transistor of the at least two vertical low-side transistors is integrated into the single low-side semiconductor die, wherein each vertical low-side transistor of the at least two vertical low-side transistors is electrically connected to the reference voltage element; and at least two switching elements, wherein each switching element of the at least two switching elements is directly electrically connected to a respective vertical high-side transistor of the at least two vertical high-side transistors, wherein each switching element of the at least two switching elements is directly electrically connected to a respective vertical low-side transistor of the at least two vertical low-side transistors, and wherein each switching element of the at least two switching elements is electrically connected through a respective trace of the at least two traces to a respective rotor coil of the at least two rotor coils or to a respective stator coil of the at least two stator coils.

18. The device of claim 17, wherein the power conversion device further comprises:

a molding compound encapsulating the single high-side semiconductor die and the single low-side semiconductor die and at least partially encapsulating the at least two switching elements; and a case encapsulating the single high-side semiconductor die, the single low-side semiconductor die, the at least two switching elements, and the molding compound and at least partially encapsulating the power supply element and the reference voltage element.

19. The device of claim 18, further comprising at least two pins extending through the case, wherein the at least two pins are configured to mount on the PCB, wherein each switching element of the at least two switching elements is electrically connected to the respective rotor coil or to the respective stator coil through a respective trace of the at least two traces and a respective pin of the at least two pins.

20. The device of claim 17, wherein:

the PCB includes power supply circuitry and reference voltage circuitry;

the power supply element and the reference voltage element are exposed on the case and configured to mount on the PCB;

the power supply element is electrically connected to the power supply circuitry through a respective trace of the at least two traces; and the reference voltage element is electrically connected to the reference voltage circuitry through a respective trace of the at least two traces.

21. The device of claim 1, wherein each switching element of the at least two switching elements is directly electrically connected to the respective high-side transistor at least in part by at least one of solder paste, soft solder, soldering, diffusion soldering, sintering, gluing, fusion bonding, metalized plated laser vias, metalized bonding, or diffusion bonding, and wherein each switching element of the at least two switching elements is directly electrically connected to the respective low-side transistor at least in part by at least one of solder paste, soft solder, soldering, diffusion soldering, sintering, gluing, fusion bonding, metalized plated laser vias, metalized bonding, or diffusion bonding.

22. The method of claim 12, wherein electrically connecting each switching element of at least two switching elements directly to the respective high-side transistor comprises at least one of soldering, diffusion soldering, sintering, gluing, fusion bonding, metalized bonding, or diffusion bonding, and wherein electrically connecting each switching element of at least two switching elements directly to the respective low-side transistor comprises at least one of soldering, diffusion soldering, sintering, gluing, fusion bonding, metalized bonding, or diffusion bonding.

23. The device of claim 17, wherein each switching element of the at least two switching elements is directly electrically connected to the respective high-side transistor at least in part by at least one of solder paste, soft solder, soldering, diffusion soldering, sintering, gluing, fusion bonding, metalized plated laser vias, metalized bonding, or diffusion bonding, and wherein each switching element of the at least two switching elements is directly electrically connected to the respective low-side transistor at least in part by at least one of solder paste, soft solder, soldering, diffusion soldering, sintering, gluing, fusion bonding, metalized plated laser vias, metalized bonding, or diffusion bonding.

* * * * *